(12) United States Patent
Nishiyama et al.

(10) Patent No.: US 8,680,932 B2
(45) Date of Patent: Mar. 25, 2014

(54) OSCILLATOR

(75) Inventors: Daisuke Nishiyama, Sayama (JP); Kenji Kasahara, Sayama (JP); Hiroyuki Murakoshi, Sayama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 0 days.

(21) Appl. No.: 13/358,818

(22) Filed: Jan. 26, 2012

(65) Prior Publication Data

US 2012/0200366 A1    Aug. 9, 2012

(30) Foreign Application Priority Data

Feb. 7, 2011  (JP) ................. P.2011-023575
Feb. 14, 2011  (JP) ................. P.2011-028223
Mar. 25, 2011  (JP) ................. P.2011-068064
Jul. 11, 2011  (JP) ................. P.2011-152916

(51) Int. Cl.
*H03B 5/32* (2006.01)
*H05K 3/34* (2006.01)

(52) U.S. Cl.
USPC ........................................ 331/158; 29/840

(58) Field of Classification Search
USPC ............................................ 331/158; 29/840
See application file for complete search history.

(56) References Cited

U.S. PATENT DOCUMENTS

2008/0173472 A1*  7/2008  Takizawa et al. ............. 174/260

FOREIGN PATENT DOCUMENTS

| JP | 07-231237 | 8/1995 |
| JP | 10-051263 | 2/1998 |
| JP | 11-135674 | 5/1999 |
| JP | 2000-332396 | 11/2000 |
| JP | 2003-037441 | 2/2003 |
| JP | 2004-200187 | 7/2004 |
| JP | 2005-203525 | 7/2005 |
| JP | 2007-089003 | 4/2007 |
| JP | 2007-104005 | 4/2007 |
| JP | 2008-238253 | 10/2008 |
| JP | 2010-087145 | 4/2010 |

\* cited by examiner

*Primary Examiner* — Joseph Chang
(74) *Attorney, Agent, or Firm* — Jacobson Holman PLLC

(57) ABSTRACT

An oscillator that can suppress a solder crack caused by a temperature change by a simple structure at low cost and improve heat cycle resistance performance is provided. The oscillator includes an epoxy resin board and an electronic component mounted on the board. Two-terminal electrode patterns are formed on the board, and connected to terminal electrodes of the electronic component by solder. A projection is formed on each of the electrode patterns at a part connected to a corresponding terminal electrode to create a space between the terminal electrode and the electrode pattern, and the solder forms a fillet in the space. This contributes to enhanced adhesion strength of the solder.

3 Claims, 12 Drawing Sheets

LINEAR EXPANSION COEFFICIENT
TYPICAL FR-4
LATERAL DIRECTION 60ppm/°C

LINEAR EXPANSION COEFFICIENT
TYPICAL FR-4
LONGITUDINAL DIRECTION 13ppm/°C
(DIRECTION WITH SMALL LINEAR EXPANSION COEFFICIENT)

LINEAR EXPANSION COEFFICIENT
TYPICAL FR-4
LATERAL DIRECTION 16ppm/°C

OSCILLATOR

This application has a priority of Japanese no. 2011-023575 filed Feb. 7, 2011, no. 2011-028223 filed Feb. 14, 2011, no. 2011-068064 filed Mar. 25, 2011 and no. 2011-152916 filed Jul. 11, 2011, hereby incorporated by reference.

BACKGROUND OF THE INVENTION

1. Field of the Invention

The present invention relates to an oscillator using a circuit board of a glass epoxy resin, and particularly relates to an oscillator that relaxes strain on solder and improves heat cycle resistance performance.

2. Description of the Related Art

[Prior Art]

Conventionally, there is a crystal oscillator that uses a glass epoxy resin in a circuit board. Metal electrode patterns are formed on the circuit board, and an electronic component of ceramic or the like is mounted on the electrode patterns by soldering.

[Conventional Crystal Oscillator: FIG. 22]

A conventional crystal oscillator is described below, with reference to FIG. 22. FIG. 22A is a plan view of the conventional crystal oscillator, and FIG. 22B is a section view of the conventional crystal oscillator.

As shown in FIG. 22, in the conventional crystal oscillator, metal pattern wires 4 are formed on a circuit board (board) 1 of a glass epoxy resin, and an electronic component 2 having two terminal electrodes 3 is mounted on the board 1. For example, the electronic component 2 is a crystal resonator, a resistor, or the like.

In particular, the terminal electrodes 3 and the pattern wires 4 are bonded by solder 5.

[Another Conventional Crystal Oscillator: FIG. 23]

Another conventional crystal oscillator is described below, with reference to FIG. 23. FIG. 23 is a section view of another conventional crystal oscillator.

As shown in FIG. 23, in another conventional crystal oscillator, metal land patterns (electrode patterns) 4 and a solder resist 8 are formed on an epoxy resin board 1, and a circuit component (electronic component) 2 is mounted on the electrode patterns 4.

In detail, component electrodes 3 are formed on the electronic component 2 at parts connected to the land patterns 4, and the component electrodes 3 and the land patterns 4 are fixed by mount solder 5.

[Related Art 1]

Related prior art includes Japanese Patent Application Laid-Open No. 2004-200187 "Printed-Wiring Board" (Nikon Corporation) [Patent Document 1], and Japanese Patent Application Laid-Open No. 2007-104005 "Surface Mount Crystal Oscillator" (Nihon Dempa Kogyo Co., Ltd.) [Patent Document 2].

[Related Art 2]

Related prior art includes Japanese Patent Application Laid-Open No. H11-135674 "Semiconductor Device and Manufacture thereof" (NEC Kansai, Ltd.) [Patent Document 3], Japanese Patent Application Laid-Open No. 2000-332396 "Mounting Structure of Electronic Components" (Alps Electric Co., Ltd.) [Patent Document 4], and Japanese Patent Application Laid-Open No. 2008-238253 "Pb-free Soldering Material, and Manufacturing Method of Semi-conductor Mounted Structure using the same" (Hitachi, Ltd.) [Patent Document 5].

[Related Art 3]

Related prior art includes Japanese Patent Application Laid-Open No. H07-231237 "Multiple Mode Crystal Vibrator and Crystal Vibrator" (Nihon Dempa Kogyo Co., Ltd.) [Patent Document 6], Japanese Patent Application Laid-Open No. H10-051263 "Crystal Vibrator" (River Eletec Corporation) [Patent Document 7], and Japanese Patent Application Laid-Open No. 2003-037441 "Piezoelectric Device and Electronic Equipment" (Seiko Epson Corp.) [Patent Document 8].

[Related Art 4]

Related prior art includes Japanese Patent Application Laid-Open No. 2005-203525 "Power Semiconductor Device and Method of Manufacturing Metal Base Plate" (Mitsubishi Electric Corporation) [Patent Document 9], Japanese Patent Application Laid-Open No. 2007-089003 "Piezoelectric Component" (TDK Corporation) [Patent Document 10], and Japanese Patent Application Laid-Open No. 2010-087145 "Electronic Component Mounting Substrate" (FDK Corporation) [Patent Document 11].

Patent Document 1 discloses that a columnar projection is provided at an electrode land where a solder ball bump is joined, and stress in a traverse direction is absorbed not only by an interface between the solder ball bump and the electrode land but also by a side surface of the projection.

Patent Document 2 discloses that, in a surface mount oscillator in which a crystal resonator and a mount substrate are joined, a projection is formed at connection terminals of the mount substrate in the case of joining the connection terminals of the mount substrate and resonator terminals of the crystal resonator by solder.

Patent Document 3 discloses a semiconductor device in which a semiconductor pellet having fine-pitch bump electrodes can be connected to a wiring board by forming a wide solder feeder on a fine conductive pattern.

Patent Document 4 discloses an electronic component mounting structure in which an insulation layer for coating an adhesive for temporarily fixing electronic components is formed in regions for mounting the electronic components so as to be thicker than a circuit pattern, so that a predetermined gap is formed between bottom faces of the electronic components mounted on the insulation layer and the circuit pattern.

Patent Document 5 discloses that a solder paste in which a Sn—Zn solder powder and a Sn powder or Zn powder having a higher melting point than the Sn—Zn solder powder are mixed is used as a soldering material, to suppress component inclination and secure soldered part thickness when mounting low heat-resistant leadless components.

Patent Document 6 discloses a structure in which a crystal chip is fixed to two support sections using a conductive adhesive on a substrate to supply a voltage from the support sections to the crystal chip, and a common lead electrode formed on a side of the crystal chip not fixed to the support sections is connected to a shield electrode formed on the substrate by wire bonding.

That is, a voltage is supplied from the two support sections on the substrate side to the crystal chip, and the common lead electrode on the opposite side of the crystal chip is connected to a ground level by wire bonding.

Patent Document 7 discloses that, in a crystal vibrator having horizontally arranged crystal vibrator bars, each crystal vibrator bar is supported only at one end while the other end is kept free, thereby eliminating stress on the crystal vibrator bars.

Patent Document 8 discloses a structure in which an IC chip is mounted in a package and an electrode on an upper surface of the IC chip and an electrode on a second layer are connected by a bonding wire.

Patent Document 9 discloses that, in a metal base plate, a low linear expansion material having an expansion coefficient equivalent or close to that of an insulating substrate is arranged at least at areas corresponding to four corners of the insulating substrate, to relax shearing stress by heat cycle and suppress a solder crack in a solder joining part between the insulating substrate and the metal base plate.

Patent Document 10 discloses that a piezoelectric unit formed by laminating a base substrate, a piezoelectric substrate, and a top plate in sequence and a printed board in which the piezoelectric unit is mounted by soldering satisfy specific conditional expressions regarding linear expansion coefficients and also Vickers hardness and maximum distortion of the base substrate are specified to thereby suppress a solder crack.

Patent Document 11 discloses that, by providing a ceramic sheet (strain suppressing body) on a top surface or internal surface of a printed wiring board facing an electronic component, a difference in expansion between the electronic component and the printed wiring board due to a temperature change near the electronic component can be reduced, resulting in a reduction in stress applied to a fillet of solder.

[Patent Document 1] Japanese Patent Application Laid-Open No. 2004-200187
[Patent Document 2] Japanese Patent Application Laid-Open No. 2007-104005
[Patent Document 3] Japanese Patent Application Laid-Open No. H11-135674
[Patent Document 4] Japanese Patent Application Laid-Open No. 2000-332396
[Patent Document 5] Japanese Patent Application Laid-Open No. 2008-238253
[Patent Document 6] Japanese Patent Application Laid-Open No. H07-231237
[Patent Document 7] Japanese Patent Application Laid-Open No. H10-051263
[Patent Document 8] Japanese Patent Application Laid-Open No. 2003-037441
[Patent Document 9] Japanese Patent Application Laid-Open No. 2005-203525
[Patent Document 10] Japanese Patent Application Laid-Open No. 2007-089003
[Patent Document 11] Japanese Patent Application Laid-Open No. 2010-087145

However, the above-mentioned conventional oscillator has a problem that, due to a difference in thermal expansion coefficient between the electronic component (circuit component) using ceramic or the like and the glass epoxy resin circuit board, strain concentrates on the mount solder in a use environment where a heat cycle occurs, causing a crack in the solder.

It is commonly known that a solder crack is more likely to occur in large components than in small components.

However, certain circuit components cannot be reduced in size because of their performance or constants, and so there are many cases where large circuit components need to be used.

Especially in an oven controlled crystal oscillator (OCXO), in a use environment where power on/off is repeated, a temperature change from an ambient temperature to an oven control temperature (e.g. 85° C.) is added at each instance of power on/off, which induces a crack in solder. Thus, there is a problem with long-term reliability.

Note, Patent Document 1 discloses that an electrode land provided with a projection and an electrode facing the electrode land are joined by a solder ball bump, where the electrode land and the facing electrode are not in contact. Though a force in a traverse direction is addressed, solder strain due to a difference in thermal expansion coefficient between the electrode land and the facing electrode is not taken into consideration.

Patent Document 2 discloses that connection terminals provided with a projection are connected to resonator terminals by solder. Here, the resonator terminals and the connection terminals are made of the same tungsten, and therefore solder strain due to a difference in thermal expansion coefficient between both terminals is not taken into consideration.

Patent Document 3 discloses that a solder feeder for easing solder feed is provided on a conductive pattern formed on a board, but does not disclose a structure in which a thickness of a land pattern as an electrode is exploited to lift an electronic component with respect to the land pattern so as to create, between the land pattern and a component electrode formed on the electronic component, a space in which solder can be easily filled.

Patent Document 4 discloses that an insulation layer having coating zones for coating an adhesive for temporarily fixing electronic components is formed to create a gap between a circuit pattern and the electronic components. Here, the dedicated insulation layer needs to be formed in order to lift the electronic components. Thus, Patent Document 4 fails to disclose a structure of easily lifting the electronic components by exploiting a normal circuit board manufacturing process.

Patent Document 5 discloses that a metallic spacer is formed on a pad on a mount substrate and a semiconductor element is mounted and soldered at a gap portion, but does not disclose a structure of increasing the amount of solder in soldering between an electrode pattern on the substrate and a component electrode of the electronic component to form a fillet, thereby strengthening adhesion.

Patent Document 6 discloses that a crystal chip is fixed to two support sections on a substrate, and so does not address substrate expansion and contraction caused by a temperature change.

Patent Document 7 merely discloses a structure of supporting each crystal vibrator bar only at one end. Patent Document 8 merely discloses a structure of connecting an IC chip fixed in a package and an electrode on a second layer by a bonding wire.

Patent Documents 9 to 11 disclose techniques for suppressing a solder crack. However, these techniques require complex conditions and structures, and are unable to suppress a solder crack caused by a temperature change by a simple structure at low cost.

SUMMARY OF THE INVENTION

The present invention was conceived in view of the above-mentioned circumstances, and has an object of providing an oscillator that can suppress a solder crack caused by a temperature change by a simple structure at low cost and improve heat cycle resistance performance.

To solve the problems of the prior art stated above, the present invention is an oscillator (an oscillator according to a first group) including an epoxy resin board and a circuit component mounted on the board, the oscillator comprising: two-terminal electrode patterns formed on the board and solder-connected to terminal electrodes of the circuit component; a projection formed on each of the electrode patterns at a part of contact with a corresponding terminal electrode; and solder applied onto the electrode pattern, the solder being filled in a space between the electrode pattern and the terminal electrode and, as a result of reflow after the circuit component is mounted, forming a fillet between the electrode pattern and a side surface of the terminal electrode. This has an advantageous effect of strengthening adhesion by thick solder formation, suppressing a solder crack caused by a temperature change by a simple structure at low cost, and improving heat cycle resistance performance.

The present invention is the oscillator according to the first group wherein the projection is formed on the electrode pattern on a side closer to the other electrode pattern facing the electrode pattern.

The present invention is the oscillator according to the first group wherein the solder forms the fillet in a space on the electrode pattern where the projection is not formed.

The present invention is the oscillator according to the first group wherein a plurality of projections are provided on each of the electrode patterns.

The present invention is the oscillator according to the first group wherein the projection has a height of 10 μm to 100 μm.

The present invention is the oscillator according to the first group wherein the projection has a height of 20 μm to 50 μm.

The present invention is the oscillator according to the first group wherein the two-terminal electrode patterns are arranged so that a direction in which the electrode patterns face each other matches a direction in which the board has a smallest linear expansion coefficient. This has an advantageous effect of suppressing a solder crack caused by a temperature change by a simple structure at low cost and improving heat cycle resistance performance.

The present invention is the oscillator according to the first group that is applied to an oven controlled crystal oscillator.

The present invention is an oscillator (a first oscillator according to a second group) including an epoxy resin board and an electronic component mounted on the board, the oscillator comprising: an electrode land pattern formed on the board; a dummy land pattern formed on the board where the electronic component is mounted; a solder resist formed so as to cover the dummy land pattern; and mount solder for solder-connecting the electrode land pattern and a component electrode formed at an end of the electronic component, in a state where the electronic component is lifted by the dummy land pattern and the solder resist. This has an advantageous effect of strengthening adhesion by thick solder formation, suppressing a solder crack caused by a temperature change by a simple structure at low cost, and improving heat cycle resistance performance.

The present invention is the first oscillator according to the second group wherein the solder resist is formed in two layers.

The present invention is a manufacturing method of an oscillator (a manufacturing method of the first oscillator according to the second group) including an epoxy resin board and an electronic component mounted on the board, the manufacturing method comprising: forming an electrode land pattern on the board and a dummy land pattern on the board where the electronic component is to be mounted; forming a solder resist so as to cover the dummy land pattern; applying solder onto the electrode land pattern; mounting the electronic component on the solder resist; and solder-connecting the electrode land pattern and a component electrode formed at an end of the electronic component by reflow, in a state where the electronic component is lifted by the dummy land pattern and the solder resist.

The present invention is the manufacturing method of the first oscillator according to the second group wherein the solder resist is formed in two layers.

The present invention is an oscillator (a second oscillator according to the second group) including an epoxy resin board and an electronic component mounted on the board, the oscillator comprising: an electrode land pattern formed on the board; a dummy land pattern formed on the board where the electronic component is mounted; a solder resist formed so as to cover the dummy land pattern; a silk print layer formed so as to cover the solder resist; and mount solder for solder-connecting the electrode land pattern and a component electrode formed at an end of the electronic component, in a state where the electronic component is lifted by the dummy land pattern, the solder resist, and the silk print layer. This has an advantageous effect of strengthening adhesion by thick solder formation, suppressing a solder crack caused by a temperature change by a simple structure at low cost, and improving heat cycle resistance performance.

The present invention is a manufacturing method of an oscillator (a manufacturing method of the second oscillator according to the second group) including an epoxy resin board and an electronic component mounted on the board, the manufacturing method comprising: forming an electrode land pattern on the board and a dummy land pattern on the board where the electronic component is to be mounted; forming a solder resist so as to cover the dummy land pattern; forming a silk print layer so as to cover the solder resist; applying solder onto the electrode land pattern; mounting the electronic component on the silk print layer; and solder-connecting the electrode land pattern and a component electrode formed at an end of the electronic component by reflow, in a state where the electronic component is lifted by the dummy land pattern, the solder resist, and the silk print layer.

The present invention is an oscillator (a third oscillator according to the second group) including an epoxy resin board and an electronic component mounted on the board, the oscillator comprising: an electrode land pattern formed on the board; a solder resist formed so as to partially cover the electrode land pattern on a side closer to a center of the electronic component; and mount solder for solder-connecting the electrode land pattern and a component electrode formed at an end of the electronic component, in a state where the electronic component is lifted by the electrode land pattern and the solder resist. This has an advantageous effect of strengthening adhesion by thick solder formation, suppressing a solder crack caused by a temperature change by a simple structure at low cost, and improving heat cycle resistance performance.

The present invention is a manufacturing method of an oscillator (a manufacturing method of the third oscillator according to the second group) including an epoxy resin board and an electronic component mounted on the board, the manufacturing method comprising: forming an electrode land pattern on the board; forming a solder resist so as to partially cover the electrode land pattern on a side closer to a center of the electronic component; applying solder onto the electrode land pattern; mounting the electronic component on the solder resist; and solder-connecting the electrode land pattern and a component electrode formed at an end of the electronic component by reflow, in a state where the electronic component is lifted by the electrode land pattern and the solder resist.

The present invention is the oscillator according to the second group that is applied to an oven controlled crystal oscillator.

The present invention is an oscillator (an oscillator according to a third group) in which an electronic component having a plurality of terminal electrodes is mounted on a board, wherein pattern wires corresponding to the plurality of terminal electrodes are formed on the board, wherein a specific terminal electrode from among the plurality of terminal electrodes is connected to a corresponding pattern wire by solder, and wherein a terminal electrode other than the specific terminal electrode from among the plurality of terminal electrodes is connected to a corresponding pattern wire by a bonding wire. This has an advantageous effect of relaxing stress on solder caused by a temperature change through relaxation of thermal stress between an electronic component and a board caused by a temperature change, suppressing a solder crack, and improving heat cycle resistance performance.

The present invention is the oscillator according to the third group wherein the terminal electrode is formed on both upper and lower surfaces of the electronic component, and wherein the bonding wire is connected to a surface of the terminal electrode opposite to a surface that is connected to the pattern wire by the solder.

The present invention is the oscillator according to the third group wherein an adhesive is provided between the board and a surface of the terminal electrode connected by the bonding wire, the surface of the terminal electrode facing the board.

The present invention is the oscillator according to the third group wherein a pattern wire is provided between the board and a surface of the terminal electrode connected by the bonding wire, the surface of the terminal electrode facing the board.

The present invention is the oscillator according to the third group wherein an electric wire material is used instead of the bonding wire.

The present invention is the oscillator according to the third group that is applied to an oven controlled crystal oscillator.

The present invention is an oscillator (a first oscillator according to a fourth group) including an epoxy resin board and a circuit component mounted on the board, wherein two-terminal electrode patterns are formed on the board and connected to terminal electrodes of the circuit component by solder, and wherein the two-terminal electrode patterns are arranged so that a direction in which the electrode patterns face each other matches a direction in which the board has a smallest linear expansion coefficient. This has an advantageous effect of suppressing a solder crack caused by a temperature change by a simple structure at low cost and improving heat cycle resistance performance.

The present invention is an oscillator (a second oscillator according to the fourth group) including an epoxy resin board and a circuit component mounted on the board, wherein four-terminal electrode patterns are formed on the board and connected to terminal electrodes of the circuit component by solder, and wherein the four-terminal electrode patterns are arranged so that a direction in which each pair of electrode patterns formed at positions corresponding to corners on the same longer side of the circuit component face each other matches a direction in which the board has a smallest linear expansion coefficient. This has an advantageous effect of suppressing a solder crack caused by a temperature change by a simple structure at low cost and improving heat cycle resistance performance.

The present invention is the oscillator according to the fourth group wherein the circuit component is made of ceramic.

The present invention is the oscillator according to the fourth group wherein a projection is provided on each of the electrode patterns at a part of contact with a corresponding terminal electrode, and the solder forms a fillet in a space created between the terminal electrode and the electrode pattern. This has an advantageous effect of enhancing solder strength, suppressing a solder crack caused by a temperature change by a simple structure at low cost, and improving heat cycle resistance performance.

The present invention is the oscillator according to the fourth group that is applied to an oven controlled crystal oscillator.

DESCRIPTION OF REFERENCE NUMERALS

Figure 1:
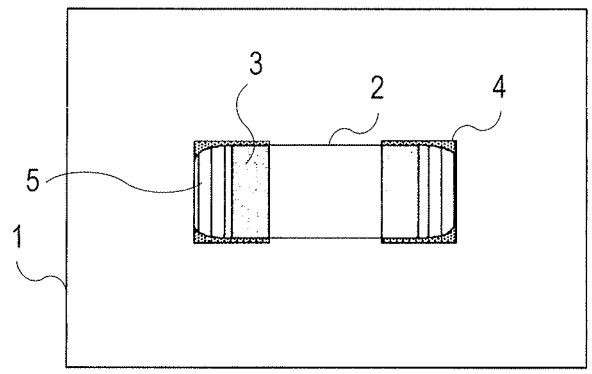
FIG. 1 is a plan view of an oscillator according to a first group.

1: board
2: electronic component

3: terminal electrode
4: electrode pattern
5: solder
6: projection (protrusion)
11: board
12: electronic component
13: component electrode
14: land pattern
15: mount solder
17: dummy land pattern
18, 18a, 18b, 18c: solder resist
19: silk print layer
21: board
22: electronic component
23, 23a, 23b: terminal electrode
24, 24a, 24b, 24c: pattern wire
25: solder
26: bonding wire
27: adhesive
31: board
32: electronic component
33: terminal electrode
34: electrode pattern
35: solder

DESCRIPTION OF PREFERRED EMBODIMENT

The following describes embodiments of the present invention with reference to drawings.

In detail, the embodiments of the present invention are classified into first to fourth groups.

[Overview of Embodiment According to First Group]

In an oscillator according to an embodiment of the present invention (an oscillator according to the first group), a projection is formed on an electrode pattern formed on a circuit board of a glass epoxy resin, at a part of contact with each terminal electrode of a circuit component. Solder is filled in a space created between the terminal electrode and the electrode pattern by the projection, and also forms a fillet on a side surface of the terminal electrode. This strengthens solder adhesion, relaxes strain on mount solder caused by a temperature change due to a difference in thermal expansion coefficient between the circuit component and the glass epoxy resin material, and improves heat cycle resistance performance.

Figure 2:
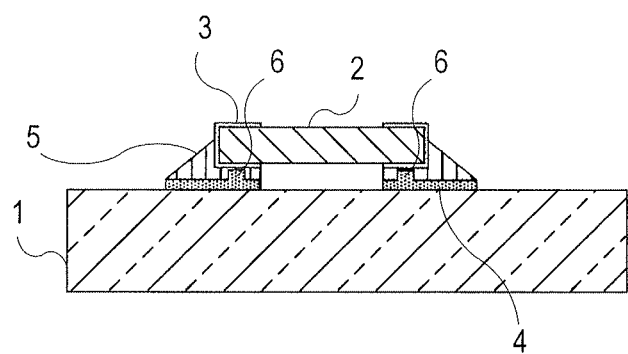
FIG. 2 is a section view of the oscillator according to the first group.

[Oscillator According to First Group: FIGS. 1 and 2]

The oscillator according to the embodiment of the present invention (the oscillator according to the first group) is described below, with reference to FIGS. 1 and 2. FIG. 1 is a plan view of the oscillator according to the first group, and FIG. 2 is a section view of the oscillator according to the first group.

As shown in FIGS. 1 and 2, in the oscillator according to the first group, metal electrode patterns 4 are formed on an epoxy resin board 1, and a circuit component (electronic component) 2 is mounted on the electrode patterns 4.

In detail, terminal electrodes 3 are formed on the electronic component 2 at parts connected to the electrode patterns 4, and the terminal electrodes 3 and the electrode patterns 4 are fixed by solder 5.

For example, the electronic component 2 is made of ceramic or the like.

As the epoxy resin material of the board 1, CEM-3 (Composite Epoxy Material 3), FR-4 (Flame Retardant Type 4), or the like is employed.

CEM-3 is a glass epoxy board based on a plate composed of a mixture of fiberglass and an epoxy resin.

FR-4 is a glass epoxy board based on a plate composed of woven fiberglass cloth impregnated with an epoxy resin.

Figure 3:
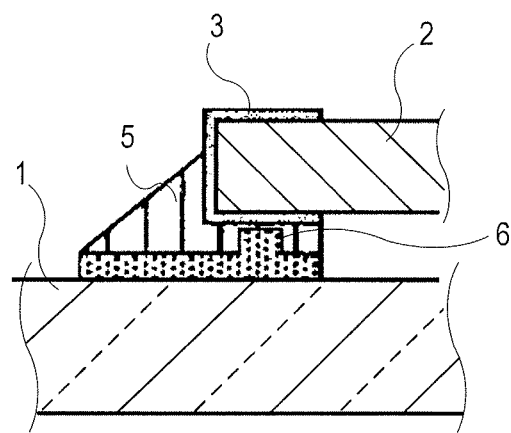
FIG. 3 is an enlarged view of a connection part (solder part) between an electrode pattern and a terminal electrode according to the first group.

[Partial Enlargement: FIG. 3]

The part where each electrode pattern 4 is connected to the corresponding terminal electrode 3 by the solder 5 is described below, with reference to FIG. 3. FIG. 3 is an enlarged view of the connection part (solder part) between the electrode pattern and the terminal electrode.

As shown in FIG. 3, a projection (protrusion) 6 is formed on the electrode pattern 4 on the board 1, at a part of contact with the terminal electrode 3 of the electronic component 2.

The solder 5 is applied onto the electrode pattern 4, and also the electronic component 2 is mounted.

In detail, a tip of the projection 6 contacts the terminal electrode 3, and the solder 5 is filled in a space created between the electrode pattern 4 and the terminal electrode 3. After reflow, the solder 5 forms a fillet on a side surface of the terminal electrode 3.

The projection 6 has a height of about 10 μm to 100 μm, and optimally has a height of about 20 μm to 50 μm, though this may differ depending on an oscillator product.

For example, the projection 6 is produced by depositing a plated layer on the electrode pattern 4 and performing masking so that a specific portion remains.

The projection 6 is formed on the electrode pattern 4 on a side closer to the other electrode pattern 4, and the solder 5 forms the above-mentioned fillet in a space where the projection 6 is not formed.

In this oscillator, the solder 5 for bonding the electrode pattern 4 and the terminal electrode 3 is increased in amount (i.e. increased in thickness), as compared with the conventional structure without the projection 6. Thus, the adhesion between the electrode pattern 4 and the terminal electrode 3 can be strengthened.

This has an advantageous effect of relaxing strain on mount solder caused by a temperature change and improving heat cycle resistance performance, even when the board 1 on which the electrode pattern 4 is formed and the electronic component 2 on which the terminal electrode 3 is formed differ in thermal expansion coefficient.

Figure 4:
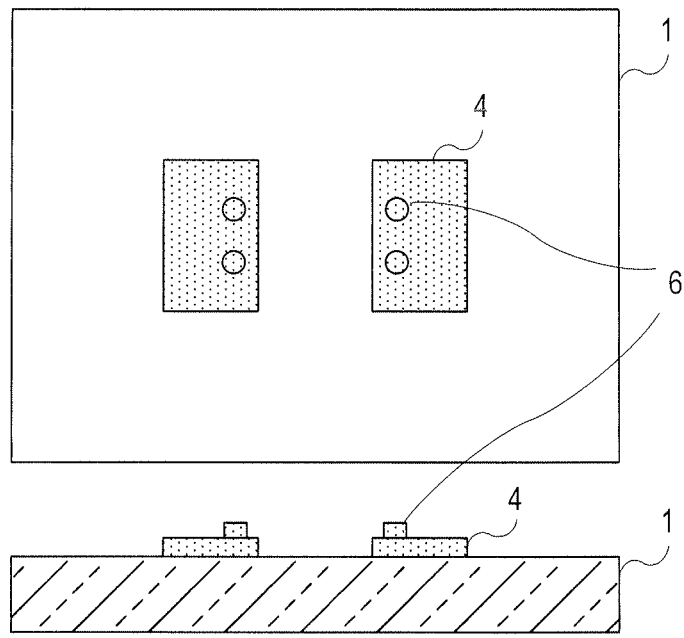
FIG. 4 is a view showing a projection shape in a first example according to the first group.
Figure 5:
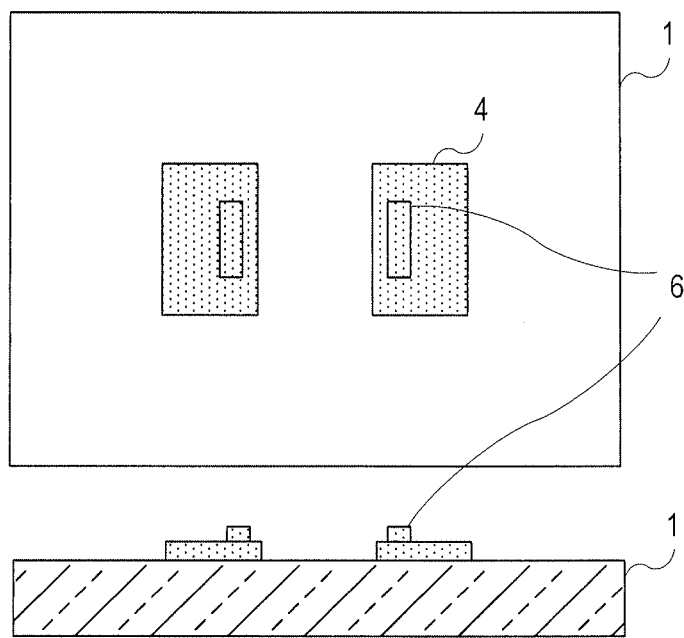
FIG. 5 is a view showing a projection shape in a second example according to the first group.
Figure 6:
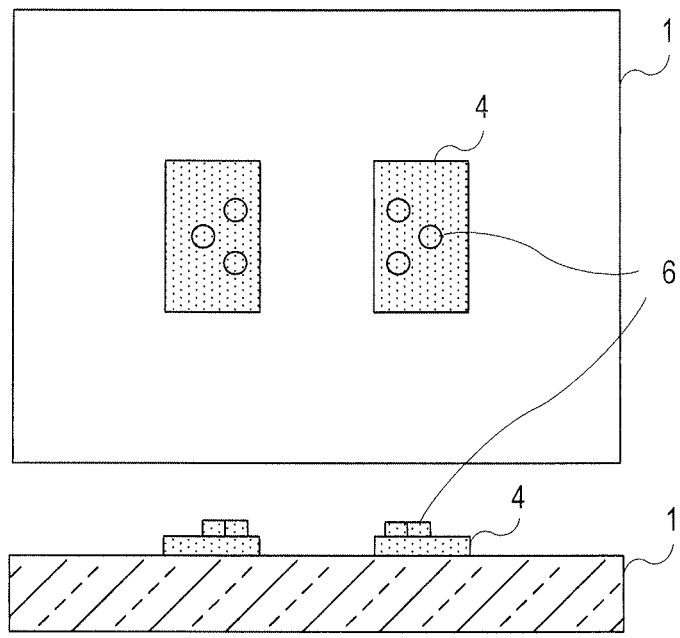
FIG. 6 is a view showing a projection shape in a third example according to the first group.
Figure 7:
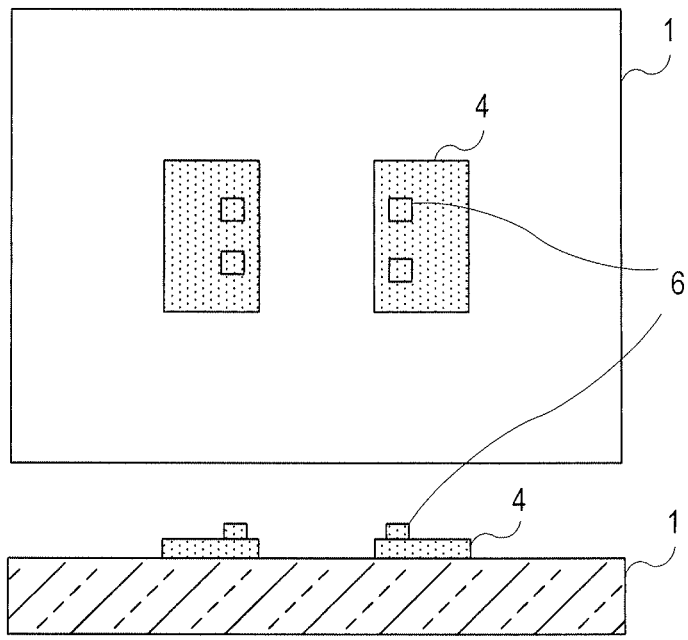
FIG. 7 is a view showing a projection shape in a fourth example according to the first group.

A shape of the projection 6 formed on the electrode pattern 4 is described below using four patterns as examples, with reference to FIGS. 4 to 7. FIG. 4 is a view showing a projection shape in a first example according to the first group. FIG. 5 is a view showing a projection shape in a second example according to the first group. FIG. 6 is a view showing a projection shape in a third example according to the first group. FIG. 7 is a view showing a projection shape in a fourth example according to the first group. In each of FIGS. 4 to 7, the upper view is a plan view, and the lower view is a section view.

[First Example According to First Group: FIG. 4]

As shown in FIG. 4, in the first example according to the first group, two cylindrical projections 6 are provided on the electrode pattern 4 on the side closer to the other electrode pattern 4.

The fillet of the solder 5 is formed in a space on the electrode pattern 4 where the projections 6 are not formed.

The cylindrical shape eases manufacturing because the projections 6 are formed by masking.

[Second Example According to First Group: FIG. 5]

As shown in FIG. 5, in the second example according to the first group, a rectangular prism projection 6 is provided on the electrode pattern 4 on the side closer to the other electrode pattern 4.

The fillet of the solder 5 is formed in a space on the electrode pattern 4 where the projection 6 is not formed, as in the first example.

Since the terminal electrode 3 and the projection 6 have a larger contact surface, the space in which the solder 5 is filled between the electrode pattern 4 and the terminal electrode 3 is reduced, as compared with the first example. Though this causes a slight decrease in adhesion strength, the electronic component 2 can be mounted more stably.

[Third Example According to First Group: FIG. 6]

As shown in FIG. 6, in the third example according to the first group, three cylindrical projections 6 are provided on the electrode pattern 4 on the side closer to the other electrode pattern 4.

The fillet of the solder 5 is formed in a space on the electrode pattern 4 where the projections 6 are not formed, as in the first example.

The cylindrical shape eases manufacturing because the projections 6 are formed by masking.

As in the second example, since the terminal electrode 3 and the projections 6 have a larger contact surface, the space in which the solder 5 is filled between the electrode pattern 4 and the terminal electrode 3 is reduced, as compared with the first example. Though this causes a slight decrease in adhesion strength, the electronic component 2 can be mounted more stably.

[Fourth Example According to First Group: FIG. 7]

As shown in FIG. 7, in the fourth example according to the first group, two rectangular prism projections 6 are provided on the electrode pattern 4 on the side closer to the other electrode pattern 4.

The fillet of the solder 5 is formed in a space on the electrode pattern 4 where the projections 6 are not formed, as in the first example.

[Embodiment of Application Example]

An application example of the above-mentioned oscillator is described below.

In the application example, the two-terminal electrode patterns 4 on which the electronic component 2 is mounted are arranged so as to face each other in a direction same as a direction in which the glass epoxy resin board 1 has a smallest linear expansion coefficient.

In the case of a typical CEM-3 board as the board 1, the linear expansion coefficient is 25 ppm/° C. in a longitudinal direction, 28 ppm/° C. in a lateral direction, and 65 ppm/° C. in a thickness direction.

In the case of a typical FR-4 board, the linear expansion coefficient is 13 ppm/° C. in the longitudinal direction, 16 ppm/° C. in the lateral direction, and 60 ppm/° C. in the thickness direction.

Meanwhile, the linear expansion coefficient of ceramic (alumina) of the electronic component 2 is, for example, about 7 ppm/° C.

Here, the long-scale direction of the board 1 is "longitudinal direction" and the short-scale direction of the board 1 is "lateral direction" in FIG. 1.

Typical FR-4 has the linear expansion coefficient of 13 ppm/° C. in the longitudinal direction, which is smaller than the linear expansion coefficient of 16 ppm/° C. in the lateral direction. On the other hand, the linear expansion coefficient of typical FR-4 in the thickness direction of the board 1 is 60 ppm/° C.

Therefore, the board 1 has the smallest linear expansion coefficient in the longitudinal direction (long-scale direction).

Hence, the direction in which the electrode patterns 4 face each other is set to match (in the same direction as) the longitudinal direction (long-scale direction) with the smallest linear expansion coefficient, as shown in FIG. 1.

That is, the two-terminal electrode patterns 4 on which the electronic component 2 is mounted are arranged so as to face each other in the same direction as the longitudinal direction in which the board 1 has the smallest linear expansion coefficient.

[Heat Cycle Resistance Performance]

The terminal electrode 3 formed on the electronic component 2 and the electrode pattern 4 formed on the board 1 are especially influenced in the longitudinal direction of the board 1 (the longer-scale direction of the board 1 in FIG. 1), by thermal expansion due to a difference in linear expansion coefficient between the electronic component 2 of ceramic or the like and the epoxy resin board 1.

This being so, when the linear expansion coefficient of the board 1 in the longitudinal direction in which the terminal electrode 3 and the electrode pattern 4 tend to be influenced by thermal expansion is small, the influence can be minimized. This has an advantageous effect of relaxing strain on the solder 5, suppressing a crack in the solder 5, and improving heat cycle resistance performance.

[Advantageous Effect of Embodiment According to First Group]

In the oscillator according to the first group, the projection 6 is formed on the electrode pattern 4 at the part connected to the terminal electrode 3 to create a space between the terminal electrode 3 and the electrode pattern 4, and the fillet of the solder 5 is formed in the space. This has an advantageous effect of enhancing the adhesion strength of the solder 5, suppressing a crack in the solder 5, and improving heat cycle resistance performance.

In the oscillator of the application example according to the first group, based on the structure of the above-mentioned oscillator, the direction in which the two-terminal electrode patterns 4 formed on the epoxy resin board 1 face each other is set to match the direction in which the linear expansion coefficient of the board 1 is small. This has an advantageous effect of relaxing strain on the solder 5 applied onto the electrode pattern 4 due to a temperature change, suppressing a crack in the solder 5, and improving heat cycle resistance performance.

The oscillator according to the first group and the oscillator of the application example according to the first group can each be effectively applied to an oven controlled crystal oscillator.

[Overview of Embodiment According to Second Group]

In an oscillator according to an embodiment of the present invention (an oscillator according to the second group), a lifter for lifting an electronic component is formed on a circuit board of a glass epoxy resin. In a part of contact between an electrode land pattern formed on the board and a component electrode of the electronic component, mount solder is filled in a space created between the component electrode and the land pattern, and also forms a fillet on a side surface of the component electrode. This strengthens mount solder adhesion, relaxes strain on mount solder caused by a temperature change due to a difference in thermal expansion coefficient between the electronic component and the glass epoxy resin material, and improves heat cycle resistance performance.

Figure 8:
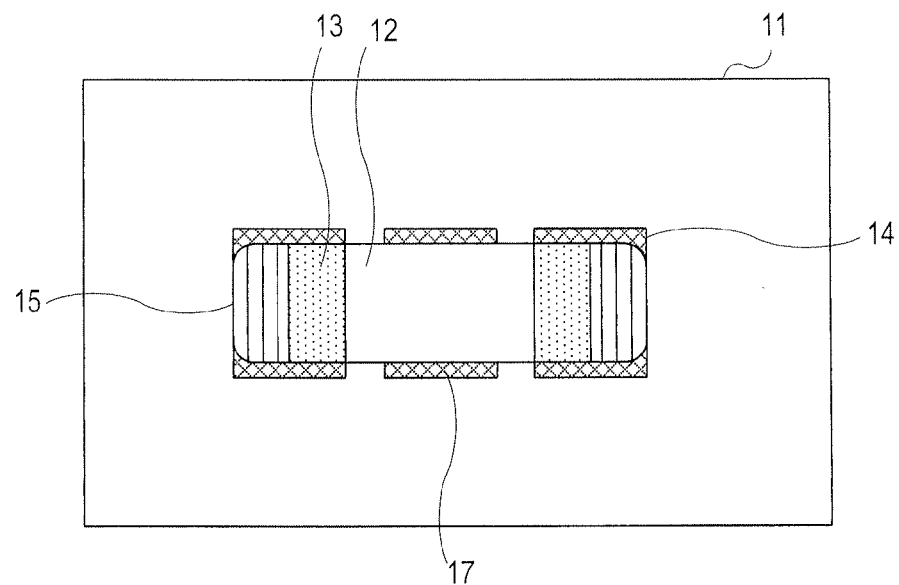
FIG. 8 is a plan view of a first oscillator according to a second group.
Figure 9A:
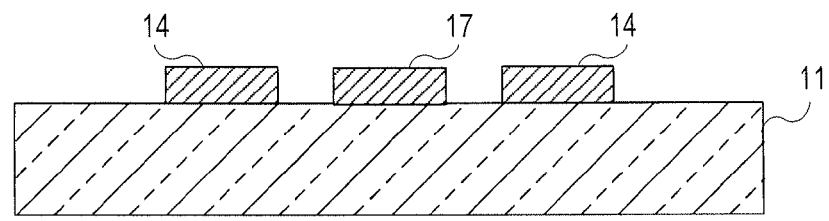
FIG. 9 is a manufacture section view of the first oscillator according to the second group.

[First Oscillator According to Second Group: FIGS. 8, 9, and 10]

An oscillator according to a first embodiment of the present invention (a first oscillator according to the second group) is described below, with reference to FIGS. 8, 9, and 10. FIG. 8 is a plan view of the first oscillator according to the second group, FIG. 9 is a manufacture section view of the first oscillator according to the second group, and FIG. 10 is a section view of the first oscillator according to the second group.

As shown in FIGS. 8 and 10, in the first oscillator according to the second group, metal land patterns (electrode patterns) 14 and dummy land pattern 17 are formed on an epoxy resin board 11, a solder resist 18a is formed on the board 11 and the dummy land pattern 17, and a circuit component (electronic component) 12 is mounted on the land patterns 14.

For example, the electronic component 12 is made of ceramic or the like, and the solder resist 18a is made of a thermosetting epoxy resin or the like.

In detail, component electrodes 13 are formed on the electronic component 12, at parts connected to the land patterns 14. That is, the component electrodes 13 are formed at ends of the electronic component 12.

The electronic component 12 is lifted from the land patterns 14 by a height corresponding to a thickness of the solder resist 18a at its center bottom part, by a lifter formed by laminating the dummy land pattern 17 and the solder resist 18a. In other words, the dummy land pattern 17 and the solder resist 18a constitute the lifter for lifting the electronic component 12.

The component electrodes 13 and the land patterns 14 are fixed by mount solder 15.

Here, the solder resist 18a is formed on the dummy land pattern 17, but is not formed on the land patterns 14 serving as electrodes.

The dummy land pattern 17 and the land patterns 14 are manufactured in the same process, and so have the same thickness. Hence, the electronic component 12 is lifted by the height corresponding to the thickness of the solder resist 18a formed on the dummy land pattern 17.

Meanwhile, on each land pattern 14, the corresponding component electrode 13 formed on the electronic component 12 is present. Accordingly, a gap between the component electrode 13 and the land pattern 14 is smaller than the lifting height.

The mount solder 15 is filled in the gap between the land pattern 14 and the component electrode 13, and also forms a fillet between the land pattern 14 and a side surface of the component electrode 13.

As the epoxy resin material of the board 11, CEM-3 (Composite Epoxy Material 3), FR-4 (Flame Retardant Type 4), or the like is employed.

CEM-3 is a glass epoxy board based on a plate composed of a mixture of fiberglass and an epoxy resin.

FR-4 is a glass epoxy board based on a plate composed of woven fiberglass cloth impregnated with an epoxy resin.

A metal layer of the land patterns 14 and the dummy land pattern 17 is typically formed with a thickness of about 10 μm to 50 μm. In FIG. 8, the thickness is about 45 μm to 50 μm, as an example.

The solder resist 18a is about 10 μm in thickness.

The solder resist 18a is shown in the section views of FIGS. 9 and 10, but is not shown in FIG. 8 for the sake of clarity.

[Manufacturing Method of First Oscillator According to Second Group: FIG. 9]

A manufacturing method of the first oscillator according to the second group is described below, with reference to FIGS. 9 and 10. FIG. 9 is a manufacture section view of the first oscillator according to the second group.

The first oscillator according to the second group is manufactured as follows. As shown in FIG. 9A, the land patterns 14 serving as electrodes and the dummy land pattern 17 are formed by a metal film, on the epoxy resin board 11.

The dummy land pattern 17 is situated at the center of the position where the electronic component 12 is mounted, while the land patterns 14 are situated at the positions where the component electrodes 13 attached to the electronic component 12 are connected.

Figure 9B:
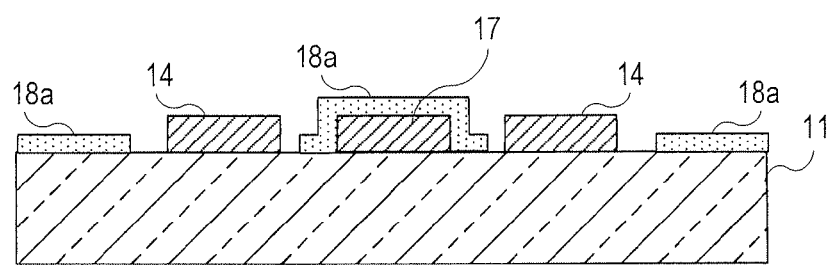
Figure 10:
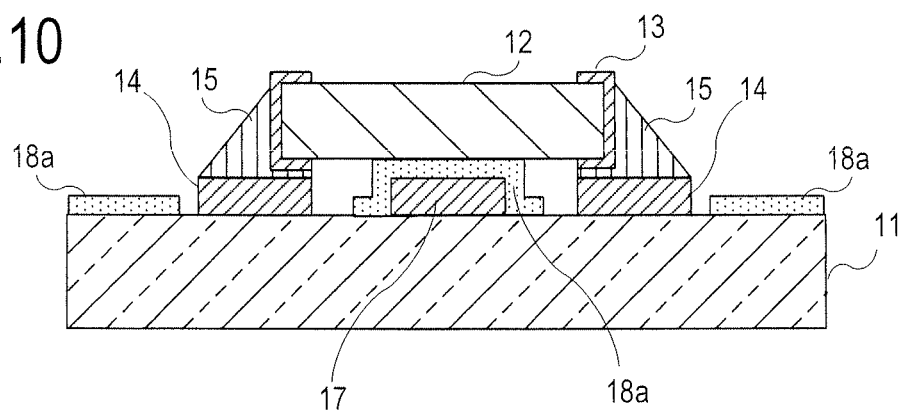
FIG. 10 is a section view of the first oscillator according to the second group.

Next, as shown in FIG. 9B, the solder resist 18a is formed at necessary parts on the board 11 so as to cover the dummy land pattern 17.

Here, the solder resist 18a does not cover the electrode land patterns 14.

The mount solder 15 is then applied onto the land patterns 14, and the electronic component 12 is mounted on the laminate structure of the dummy land pattern 17 and the solder resist 18a so that each component electrode 13 is positioned on the corresponding land pattern 14.

In detail, since the electronic component 12 is lifted by the thickness of the dummy land pattern 17 and the solder resist 18a, the mount solder 15 is filled in a space (gap) created between the component electrode 13 and the land pattern 14. After reflow, the fillet of the mount solder 15 is formed on the side surface of the component electrode 13.

Figure 23:
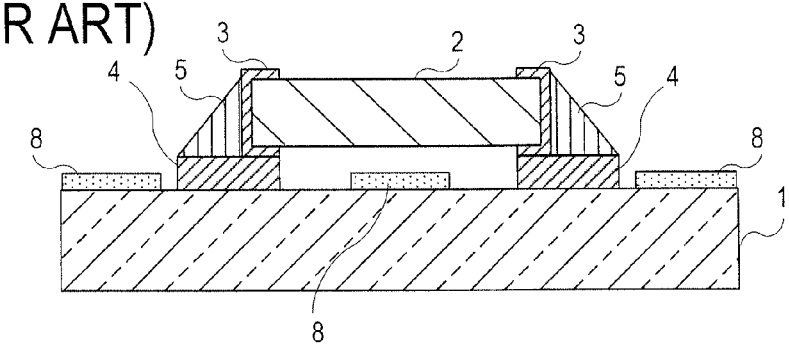
FIG. 23 is a section view of another conventional crystal oscillator.

In the first oscillator according to the second group, the mount solder 15 for bonding the land pattern 14 and the component electrode 13 is increased in amount (i.e. increased in thickness), as compared with the conventional structure shown in FIG. 23. Thus, the adhesion between the land pattern 14 and the component electrode 13 can be strengthened.

This has an advantageous effect of relaxing strain on the mount solder 15 caused by a temperature change and improving heat cycle resistance performance, even when the board 11 on which the land pattern 14 is formed and the electronic component 12 on which the component electrode 13 is formed differ in thermal expansion coefficient.

[Application Example of First Oscillator According to Second Group: FIG. 11]

An application example of the first oscillator according to the second group is described below, with reference to FIG. 11. FIG. 11 is a manufacture section view showing the application example of the first oscillator according to the second group.

In the application example of the first oscillator shown in FIG. 11, the lifting height of the electronic component 12 is increased as compared with that in FIG. 10, by forming the solder resist in two layers.

Solder resists 18a and 18b are each about 10 μm in thickness. Accordingly, in the case of forming two solder resist layers, the solder resist thickness is about 20 μm. As a result, the electronic component 12 is lifted higher than in the first oscillator, by about 10 μm.

Figure 11A:
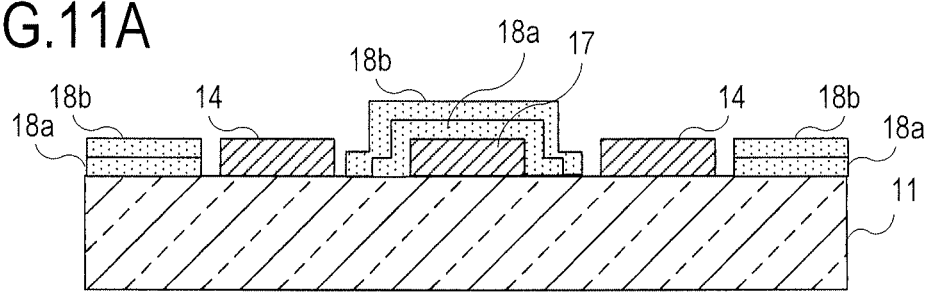
FIG. 11 is a manufacture section view showing an application example of the first oscillator according to the second group.
Figure 11B:
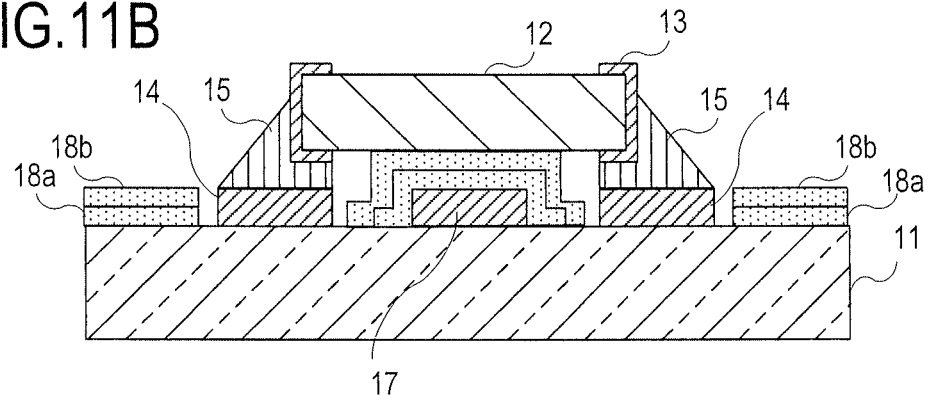

In detail, as shown in FIG. 11A, the land patterns 14 and 17 are formed on the board 11, the solder resist 18a is formed on the dummy land pattern 17 and the board 11, and the solder resist 18b is formed on the solder resist 18a.

The mount solder 15 is then applied onto the land patterns 14, and the electronic component 12 is mounted on the solder resist 18b in a state of being lifted from the land patterns 14. The mount solder 15 is filled in a space (gap) created between the corresponding component electrode 13 and land pattern 14 and, after reflow, forms a fillet on the side surface of the component electrode 13.

In the application example of the first oscillator according to the second group, the gap between the land pattern 14 and the component electrode 13 is increased and so the amount of the mount solder 15 filled is increased, as compared with the first oscillator in FIG. 10. Thus, the adhesion between the land pattern 14 and the component electrode 13 can be strengthened. This has an advantageous effect of relaxing strain on the mount solder 15 caused by a temperature change and improving heat cycle resistance performance, even when the board 11 and the electronic component 12 differ in thermal expansion coefficient.

Figure 12:
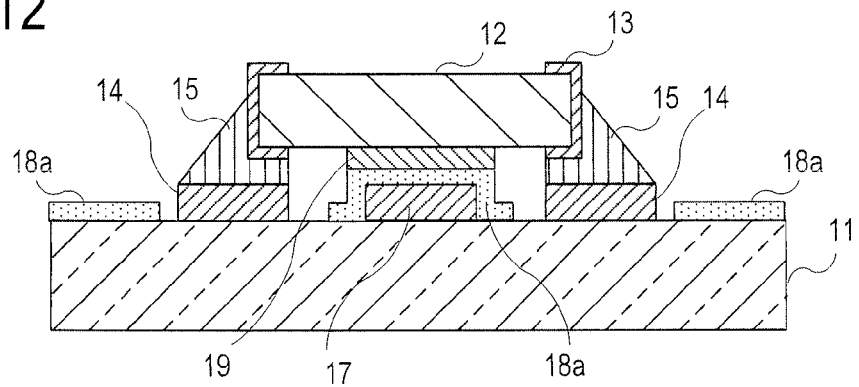
FIG. 12 is a section view of a second oscillator according to the second group.

[Second Oscillator According to Second Group: FIG. 12]

An oscillator according to a second embodiment of the present invention (a second oscillator according to the second group) is described below, with reference to FIG. 12. FIG. 12 is a section view of the second oscillator according to the second group.

As shown in FIG. 12, in the second oscillator according to the second group, a silk print layer 19 is formed on the upper surface of the solder resist 18a in the first oscillator in FIG. 10, and the electronic component 12 is mounted on the silk print layer 19.

The silk print layer 19 is an insulation ink layer produced by silk-screen printing (silk printing).

Hence, the electronic component 12 has the component electrodes 13 lifted from the land patterns 14, by the dummy land pattern 17, the solder resist 18a, and the silk print layer 19. In other words, the dummy land pattern 17, the solder resist 18a, and the silk print layer 19 constitute the lifter.

Here, the silk print layer 19 is about 10 μm in thickness.

Since resist formation and silk printing are typically performed in an oscillator manufacturing process, silk printing is employed here. This contributes to a more efficient manufacturing process than in the application example of the first oscillator according to the second group where the two layers of the solder resists 18a and 18b are formed.

In the second oscillator according to the second group, the solder resist 18a and the silk print layer 19 are about 20 μm in total thickness, which is equivalent to the thickness in the application example of the first oscillator (the solder resist 18a of about 10 μm in thickness+the solder resist 18b of about 10 μm in thickness=about 20 μm). Therefore, the same effect of lifting the electronic component 12 can be attained.

In the second oscillator according to the second group, by forming the solder resist 18a and the silk print layer 19 on the dummy land pattern 17, the space created between the land pattern 14 and the component electrode 13 is increased and so the amount of the mount solder 15 filled in the space is increased. Thus, the adhesion between the land pattern 14 and the component electrode 13 can be strengthened. This has an advantageous effect of relaxing strain on the mount solder 15 caused by a temperature change and improving heat cycle resistance performance, even when the board 11 and the electronic component 12 differ in thermal expansion coefficient.

[Third Oscillator According to Second Group: FIG. 13]

An oscillator according to a third embodiment of the present invention (a third oscillator according to the second group) is described below, with reference to FIG. 13. FIG. 13 is a manufacture section view of the third oscillator according to the second group.

Figure 13A:
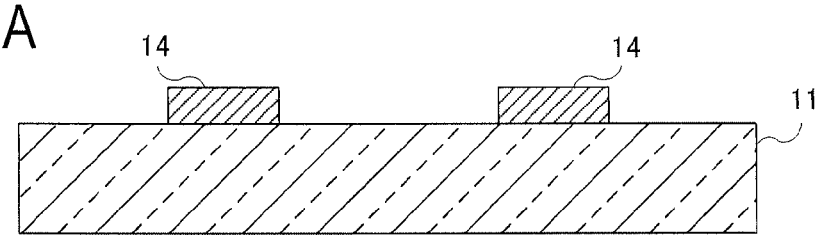
FIG. 13 is a manufacture section view of a third oscillator according to the second group.
Figure 13B:
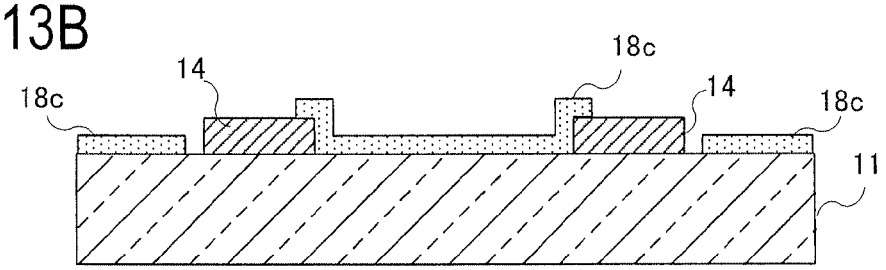

In the third oscillator according to the second group, the land patterns 14 are formed on the board 11 as shown in FIG. 13A, and a solder resist 18c is formed so as to partially cover each land pattern 14 as shown in FIG. 13B.

Here, the land patterns 14 are about 45 μm to 50 μm in thickness, and the solder resist 18c is about 10 μm in thickness.

The part of each land pattern 14 on which the solder resist 18c is formed is a part closer to the center of the electronic component 12 mounted.

In FIG. 13, the solder resist 18c is formed in an entire area underneath the electronic component 12, so as to partially cover the land patterns 14 facing each other.

Moreover, it is desirable that the solder resist 18c supports only a part of the component electrode 13 on the board 11 side. If the solder resist 18c occupies the area between the land pattern 14 and the component electrode 13, the adhesion by the mount solder 15 is weakened. To prevent this, it is desirable to create a space between the component electrode 13 and the land pattern 14 to thereby achieve strong adhesion by the mount solder 15.

Figure 13C:
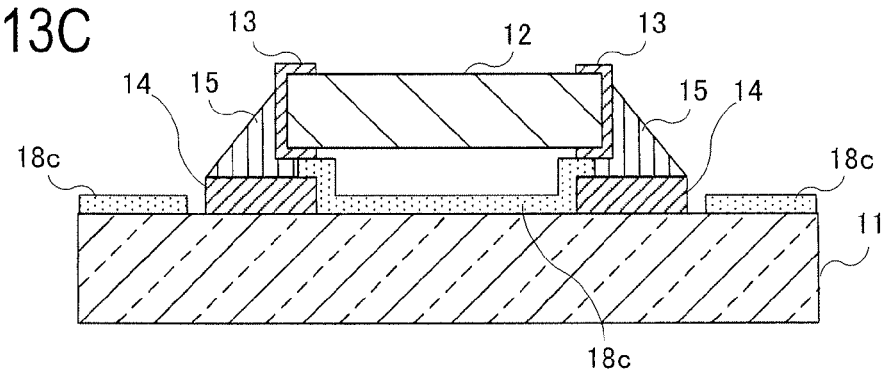

As shown in FIG. 13C, the mount solder 15 is then applied onto the land patterns 14, and the electronic component 12 is mounted so that the component electrodes 13 of the electronic component 12 are in contact with the solder resist 18c formed on the land patterns 14. The mount solder 15 is filled in a space created between each component electrode 13 and the corresponding land pattern 14 and, after reflow, forms a fillet on the side surface of the component electrode 13.

In the third oscillator according to the second group, the electronic component 12 is lifted by the solder resist 18c formed so as to partially cover the land pattern 14 so that a space (gap) is created between the component electrode 13 and the land pattern 14. The mount solder 15 is filled in the space and also forms a fillet on the side surface of the component electrode 13. This has an advantageous effect of strengthening the adhesion of the mount solder 15.

In other words, the part of the land pattern 14 and the solder resist 18c formed on the part of the land pattern 14 constitute the lifter for lifting the electronic component 12.

This technique of the third oscillator according to the second group is applicable to small components. The first and second oscillators are not suitable for small components, because the lifter needs to be formed between the land patterns 14 serving as electrodes. On the other hand, the third oscillator can be applied to small components so long as patterning is accurately performed.

[Advantageous Effect of Embodiment According to Second Group]

In the first oscillator according to the second group, a space is created between the land pattern 14 and the component electrode 13, so that the mount solder 15 for bonding the land pattern 14 and the component electrode 13 is increased in amount. Thus, the adhesion between the land pattern 14 and the component electrode 13 can be strengthened. This has an advantageous effect of relaxing strain on the mount solder 15 caused by a temperature change and improving heat cycle resistance performance, even when the board 11 on which the land pattern 14 is formed and the electronic component 12 on which the component electrode 13 is formed differ in thermal expansion coefficient.

In the application example of the first oscillator according to the second group, by covering the dummy land pattern 17 with the two layers of the solder resists 18a and 18b, the space between the land pattern 14 and the component electrode 13 is increased and so the amount of the mount solder 15 filled in the space is increased. Thus, the adhesion between the land pattern 14 and the component electrode 13 can be strengthened. This has an advantageous effect of relaxing strain on the mount solder 15 caused by a temperature change and improving heat cycle resistance performance, even when the board 11 and the electronic component 12 differ in thermal expansion coefficient.

In the second oscillator according to the second group, by forming the solder resist 18a and the silk print layer 19 on the dummy land pattern 17, the space between the land pattern 14 and the component electrode 13 is increased and so the amount of the mount solder 15 filled in the space is increased. Thus, the adhesion between the land pattern 14 and the component electrode 13 can be strengthened. This has an advantageous effect of relaxing strain on the mount solder 15 caused by a temperature change and improving heat cycle resistance performance, even when the board 11 and the electronic component 12 differ in thermal expansion coefficient.

In the third oscillator according to the second group, the electronic component 12 is lifted by the solder resist 18*c* formed so as to partially cover the land pattern 14, to create a space between the component electrode 13 and the land pattern 14. The mount solder 15 is filled in the space, and also the fillet of the mount solder 15 is formed on the side surface of the component electrode 13. Thus, the adhesion of the mount solder 15 can be strengthened. This has an advantageous effect of relaxing strain on the mount solder 15 caused by a temperature change and improving heat cycle resistance performance, even when the board 11 and the electronic component 12 differ in thermal expansion coefficient.

The first to third oscillators according to the second group can each be effectively applied to an oven controlled crystal oscillator.

[Overview of Embodiment According to Third Group]

In an oscillator according to an embodiment of the present invention (an oscillator according to the third group), an electronic component having two terminal electrodes is mounted on a board of a glass epoxy resin. Pattern wires are formed on the board in correspondence with the terminal electrodes. One terminal electrode is connected to a corresponding pattern wire by solder, whereas the other terminal electrode is connected to a corresponding pattern wire by a bonding wire. This relaxes stress on mount solder caused by a temperature change due to a difference in linear expansion coefficient between the circuit component and the glass epoxy resin material, and improves heat cycle resistance performance.

[First Crystal Oscillator According to Third Group: FIG. 14]

Figure 14A:
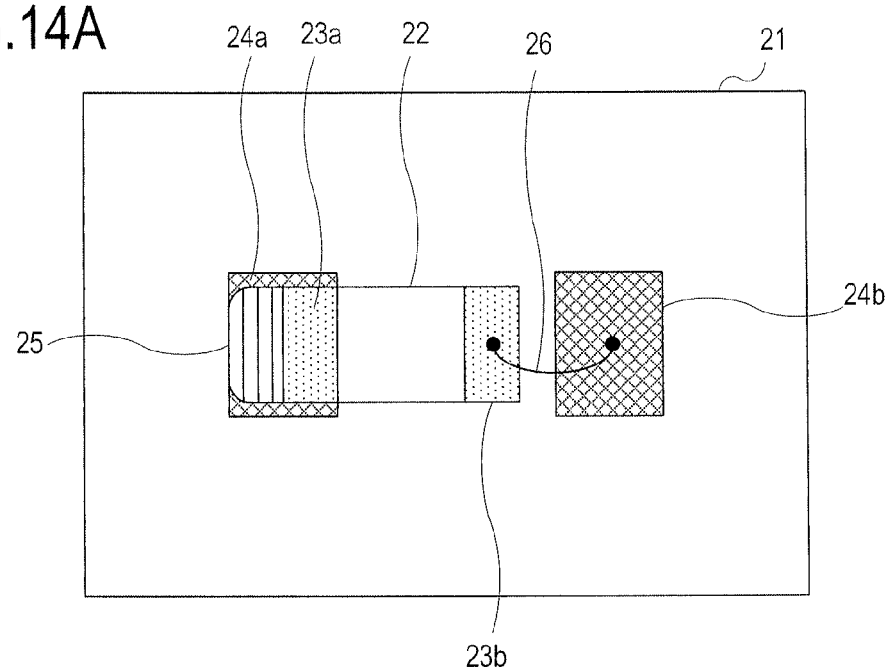
FIG. 14A is a plan view of a first crystal oscillator according to a third group.
Figure 14B:
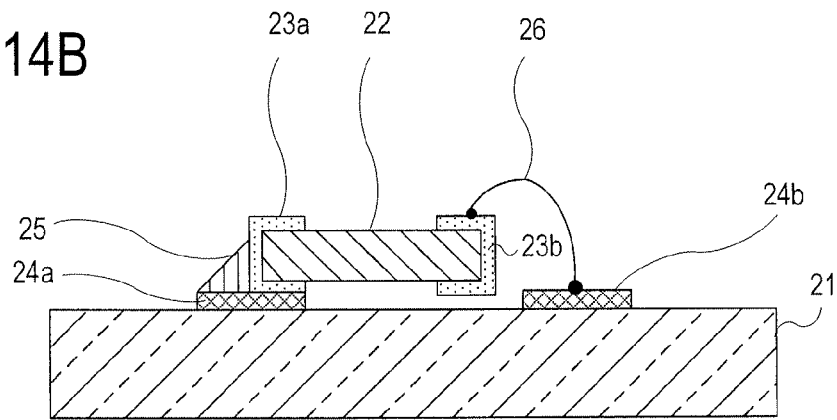
FIG. 14B is a section view of the first crystal oscillator according to the third group.

A crystal oscillator according to a first embodiment of the present invention (a first crystal oscillator according to the third group) is described below, with reference to FIG. 14. FIG. 14A is a plan view of the first crystal oscillator according to the third group, and FIG. 14B is a section view of the first crystal oscillator according to the third group.

As shown in FIG. 14, in the first crystal oscillator according to the third group, two pattern wires 24*a* and 24*b* are formed on a circuit board (board) 21 of a glass epoxy resin, and an electronic component 22 provided with terminal electrodes 23*a* and 23*b* is mounted on the board 21.

In detail, the pattern wire 24*a* and the terminal electrode 23*a* are connected by solder 25, whereas the terminal electrode 23*b* and the pattern wire 24*b* are connected by a bonding wire 26.

CEM-3 (Composite Epoxy Material 3), FR-4 (Flame Retardant Type 4), or the like is used as the material of the board 21.

CEM-3 is a glass epoxy board based on a plate composed of a mixture of fiberglass and an epoxy resin.

FR-4 is a glass epoxy board based on a plate composed of woven fiberglass cloth impregnated with an epoxy resin.

In the case of a typical CEM-3 board, the linear expansion coefficient is 25 ppm/° C. in a longitudinal direction, 28 ppm/° C. in a lateral direction, and 65 ppm/° C. in a thickness direction.

In the case of a typical FR-4 board, the linear expansion coefficient is 13 ppm/° C. in the longitudinal direction, 16 ppm/° C. in the lateral direction, and 60 ppm/° C. in the thickness direction.

Meanwhile, the linear expansion coefficient of ceramic (alumina) of the circuit component is, for example, about 7 ppm/° C.

For example, the electronic component 22 is a crystal resonator, a large resistor, or the like.

The pattern wires 24*a* and 24*b* and the terminal electrodes 23*a* and 23*b* are made of conductive metal.

Here, an electric wire material may be used instead of the bonding wire 26.

[Manufacturing Method of First Crystal Oscillator According to Third Group]

In a manufacturing method of the first crystal oscillator according to the third group, the pattern wires 24*a* and 24*b* are formed on the glass epoxy resin board 21, the electronic component 22 having the terminal electrodes 23*a* and 23*b* is mounted, the pattern wire 24*a* and the terminal electrode 23*a* are connected and bonded by the solder 25, and the terminal electrode 23*b* and the pattern wire 24*b* are connected by the bonding wire 26.

In particular, a part of a surface (upper surface) of the terminal electrode 23*b* opposite to a surface facing the board 21 is connected to the pattern wire 24*b* by the bonding wire 26. This is because the connection by the bonding wire 26 can be easily made from the upper surface.

Figure 15:
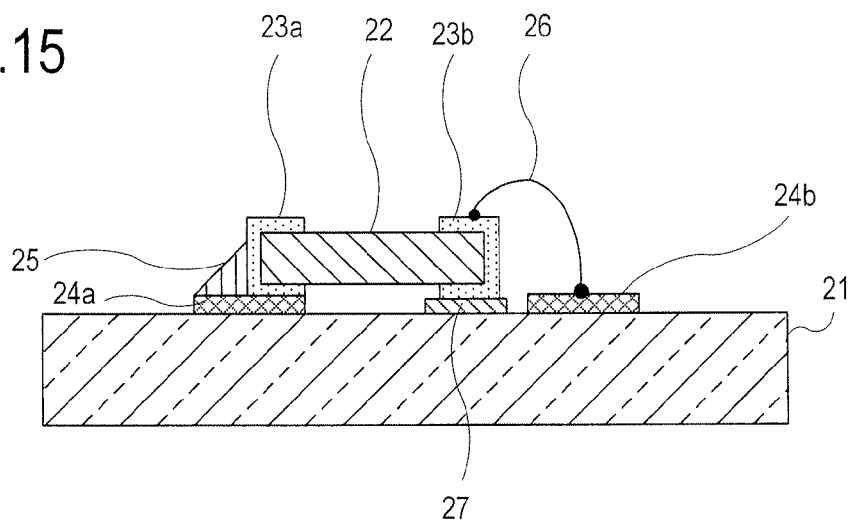
FIG. 15 is a section view of a second crystal oscillator according to the third group.

[Second Crystal Oscillator According to Third Group: FIG. 15]

A crystal oscillator according to a second embodiment of the present invention (a second crystal oscillator according to the third group) is described below, with reference to FIG. 15. FIG. 15 is a section view of the second crystal oscillator according to the third group.

As shown in FIG. 15, the second crystal oscillator according to the third group is similar to the first crystal oscillator in FIG. 14, but differs in that an adhesive 27 is inserted between the board 21 and the terminal electrode 23*b* on the board 21 side to bond the terminal electrode 23*b* and the board 21 by the adhesive 27.

The bonding by the adhesive 27 can prevent the electronic component 22 from becoming unstable.

[Manufacturing Method of Second Crystal Oscillator According to Third Group]

In a manufacturing method of the second crystal oscillator according to the third group, the pattern wires 24*a* and 24*b* are formed on the glass epoxy resin board 21, the adhesive 27 is applied, the electronic component 22 having the terminal electrodes 23*a* and 23*b* is mounted, the board 21 and the terminal electrode 23*b* are bonded by the adhesive 27, the pattern wire 24*a* and the terminal electrode 23*a* are connected and bonded by the solder 25, and the terminal electrode 23*b* and the pattern wire 24*b* are connected by the bonding wire 26.

Here, the adhesive 27 may be inserted after the solder 25 is formed.

Figure 16:
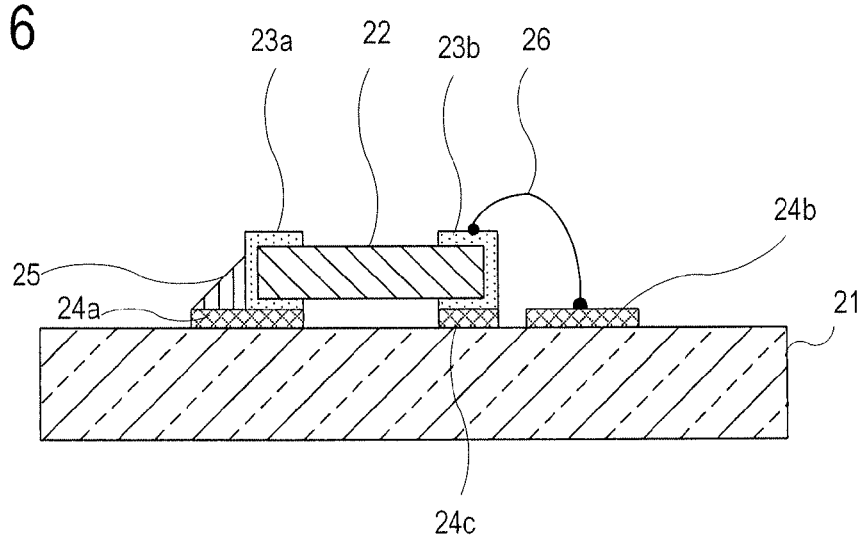
FIG. 16 is a section view of a third crystal oscillator according to the third group.

[Third Crystal Oscillator According to Third Group: FIG. 16]

A crystal oscillator according to a third embodiment of the present invention (a third crystal oscillator according to the third group) is described below, with reference to FIG. 16. FIG. 16 is a section view of the third crystal oscillator according to the third group.

As shown in FIG. 16, the third crystal oscillator according to the third group is similar to the first crystal oscillator in FIG. 14 or the second crystal oscillator in FIG. 15, but differs in that a pattern wire 24*c* is formed between the board 21 and the terminal electrode 23*b* on the board 21 side to connect the terminal electrode 23*b* and the board 21 by the pattern wire 24*c*.

The connection by the pattern wire 24c can prevent the electronic component 22 from becoming unstable.

Note, since the terminal electrode 23b is electrically connected to the pattern wire 24b by the bonding wire 26, the pattern wire 24c is merely used to fill up the gap between the terminal electrode 23b and the board 21 and does not provide electrical connection.

Moreover, while the terminal electrode 23a and the pattern wire 24a are bonded by the solder 25, the terminal electrode 23b and the pattern wire 24c are not bonded by the solder 25 but are in a state where the terminal electrode 23b is placed on the pattern wire 24c.

[Manufacturing Method of Third Crystal Oscillator According to Third Group]

In a manufacturing method of the third crystal oscillator according to the third group, the pattern wires 24a, 24b, and 24c are formed on the glass epoxy resin board 21, the electronic component 22 having the terminal electrodes 23a and 23b is mounted, the pattern wire 24c and the terminal electrode 23b are connected (in contact), the pattern wire 24a and the terminal electrode 23a are connected and bonded by the solder 25, and the terminal electrode 23b and the pattern wire 24b are connected by the bonding wire 26.

[Advantageous Effect of Embodiment According to Third Group]

In the first crystal oscillator according to the third group, the pattern wires 24a and 24b are formed on the epoxy resin board 21, and the electronic component 22 having the terminal electrodes 23a and 23b is mounted on the board 21, where the terminal electrode 23a and the pattern wire 24a are connected by the solder 25 whereas the terminal electrode 23b and the pattern wire 24b are connected by the bonding wire 26. This has an advantageous effect of relaxing stress on the solder 25 caused by a temperature change by relaxation of thermal stress between the electronic component 22 and the board 21 caused by a temperature change, suppressing a crack in the solder 25, and improving heat cycle resistance performance.

In the second crystal oscillator according to the third group, the terminal electrode 23b and the board 21 are bonded by the adhesive 27. This has an advantageous effect of stabilizing the electronic component 22, in addition to the advantageous effect of the first crystal oscillator.

In the third crystal oscillator according to the third group, the terminal electrode 23b and the board 21 are connected by the pattern wire 24c. This has an advantageous effect of stabilizing the electronic component 22, in addition to the advantageous effect of the first crystal oscillator.

[Overview of Embodiment According to Fourth Group]

In an oscillator according to an embodiment of the present invention (an oscillator according to the fourth group), a direction in which electrode patterns formed on a circuit board of a glass epoxy resin and soldered to a large circuit component mounted thereon face each other is set to match a direction in which the circuit board has a smallest linear expansion coefficient. This relaxes stress on mount solder caused by a temperature change due to a difference in linear expansion coefficient between the circuit component and the glass epoxy resin material, and improves heat cycle resistance performance.

Figure 17:
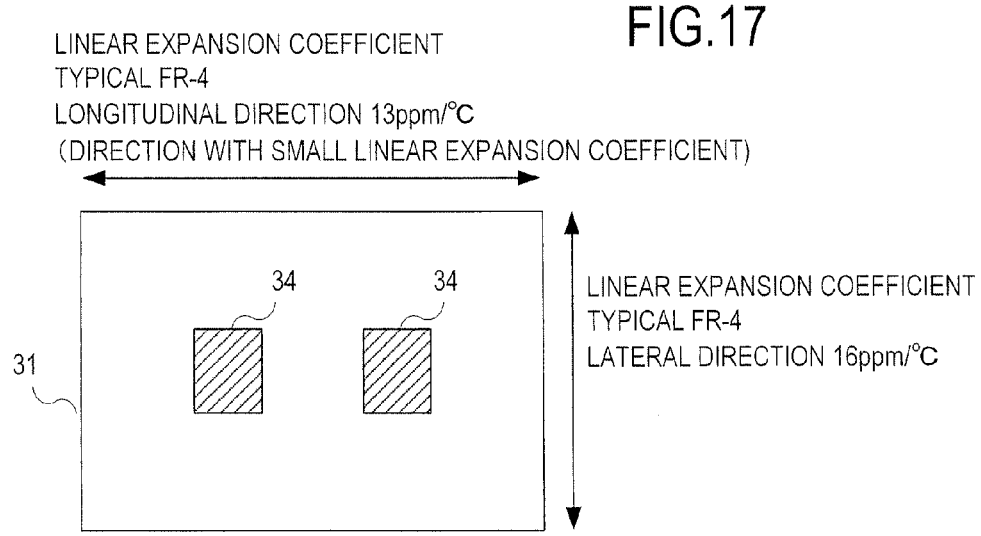
FIG. 17 is a schematic view showing two-terminal electrode patterns on a board of an oscillator according to a fourth group.

[Two-Terminal Electrode Patterns: FIG. 17]

The oscillator according to the embodiment of the present invention (the oscillator according to the fourth group) is described below, with reference to FIG. 17. FIG. 17 is a schematic view showing two-terminal electrode patterns on a board in the oscillator according to the fourth group.

As shown in FIG. 17, in the oscillator according to the embodiment of the present invention (the oscillator according to the fourth group), two-terminal electrode patterns 34 are formed on a circuit board (board) 31 of a glass epoxy resin.

CEM-3 (Composite Epoxy Material 3), FR-4 (Flame Retardant Type 4), or the like is used as the material of the board 31.

CEM-3 is a glass epoxy board based on a plate composed of a mixture of fiberglass and an epoxy resin.

FR-4 is a glass epoxy board based on a plate composed of woven fiberglass cloth impregnated with an epoxy resin.

In the case of a typical CEM-3 board, the linear expansion coefficient is 25 ppm/° C. in a longitudinal direction, 28 ppm/° C. in a lateral direction, and 65 ppm/° C. in a thickness direction.

In the case of a typical FR-4 board, the linear expansion coefficient is 13 ppm/° C. in the longitudinal direction, 16 ppm/° C. in the lateral direction, and 60 ppm/° C. in the thickness direction.

Meanwhile, the linear expansion coefficient of ceramic (alumina) of the circuit component is, for example, about 7 ppm/° C.

Here, the long-scale direction of the board 31 is "longitudinal direction" and the short-scale direction of the board 31 is "lateral direction" in FIG. 17.

Typical FR-4 has the linear expansion coefficient of 13 ppm/° C. in the longitudinal direction, which is smaller than the linear expansion coefficient of 16 ppm/° C. in the lateral direction.

On the other hand, the linear expansion coefficient of typical FR-4 in the thickness direction of the board 31 is 60 ppm/° C.

Therefore, the board 31 has the smallest linear expansion coefficient in the longitudinal direction.

Hence, the direction in which the electrode patterns 34 face each other is set to match (in the same direction as) the longitudinal direction with the smallest linear expansion coefficient, as shown in FIG. 17.

The two-terminal electrode patterns 34 are electrode patterns on which a large circuit component is mounted.

Figure 18:
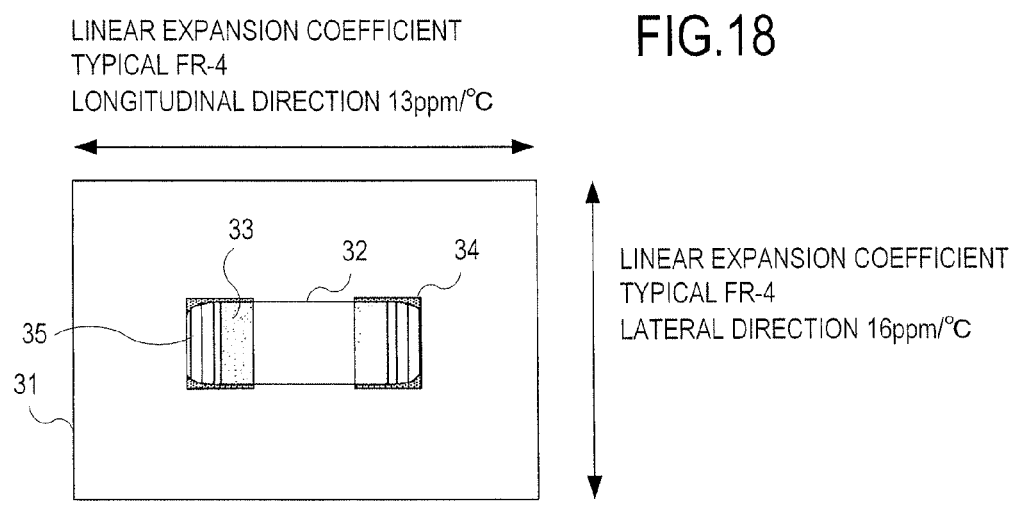
FIG. 18 is a plan view of the oscillator according to the fourth group.
Figure 19:
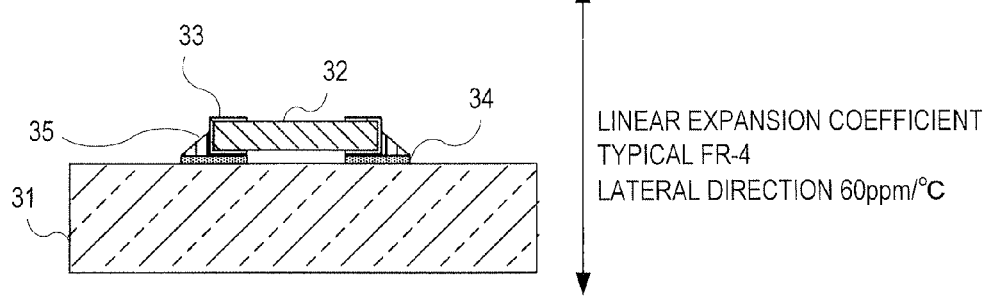
FIG. 19 is a section view of the oscillator according to the fourth group.

[Structure of Oscillator According to Fourth Group: FIGS. 18 and 19]

A structure of the oscillator according to the fourth group is described below, with reference to FIGS. 18 and 19. FIG. 18 is a plan view of the oscillator according to the fourth group, and FIG. 19 is a section view of the oscillator according to the fourth group.

As shown in FIGS. 18 and 19, in the oscillator according to the fourth group, the metal electrode patterns 34 are formed on the epoxy resin board 31, and a circuit component (electronic component) 32 is mounted on the electrode patterns 34.

In detail, terminal electrodes 33 are formed on the electronic component 32 at parts connected to the electrode patterns 34, and the terminal electrodes 33 and the electrode patterns 34 are fixed by solder 35.

The two-terminal electrode patterns 34 on which the electronic component 32 is mounted are arranged so as to face each other in the same direction as the longitudinal direction in which the linear expansion coefficient of the board 31 is smallest.

[Heat Cycle Resistance Performance]

The terminal electrode 33 formed on the electronic component 32 and the electrode pattern 34 formed on the board 31 are especially influenced in the longitudinal direction of the board 31 (the longer-scale direction of the board 31 in FIG. 17), by thermal expansion due to a difference in linear expansion coefficient between the electronic component 32 of ceramic or the like and the epoxy resin board 31.

Accordingly, when the linear expansion coefficient of the board 31 in the longitudinal direction in which the terminal electrode 32 and the electrode pattern 34 tend to be influenced is small, the influence can be minimized. This has an advantageous effect of relaxing stress on the solder 35, suppressing a crack in the solder 35, and improving heat cycle resistance performance.

Figure 20:
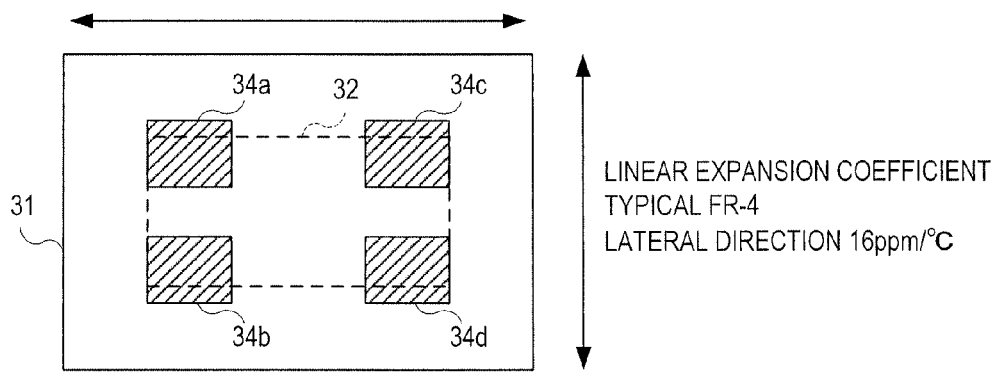
FIG. 20 is a schematic view showing four-terminal electrode patterns according to the fourth group.

[Four-Terminal Electrode Patterns: FIG. 20]

Four-terminal electrode patterns are described below, with reference to FIG. 20. FIG. 20 is a schematic view showing the four-terminal electrode patterns.

The arrangement of the four-terminal electrode patterns is determined in accordance with the shape of the electronic component 32 mounted.

In detail, in the case where terminal electrodes are provided at corners of the rectangular electronic component 32 and electrode patterns 34a to 34d connected to the terminal electrodes are formed on the board 31, a direction in which the electrode patterns 34a and 34b formed at positions corresponding to corners on one shorter side of the electronic component 32 face the electrode patterns 34c and 34d formed at positions corresponding to corners on the other shorter side of the electronic component 32 is set to match the longitudinal direction of the board 31.

In other words, a direction in which the electrode patterns 34a and 34c or the electrode patterns 34b and 34d formed at positions corresponding to corners on the same longer side of the electronic component 32 face each other is set to match the longitudinal direction of the board 31.

The above-mentioned arrangement of the four-terminal electrode patterns has an advantageous effect of relaxing stress on solder, suppressing a solder crack, and improving heat cycle resistance performance.

Figure 21:
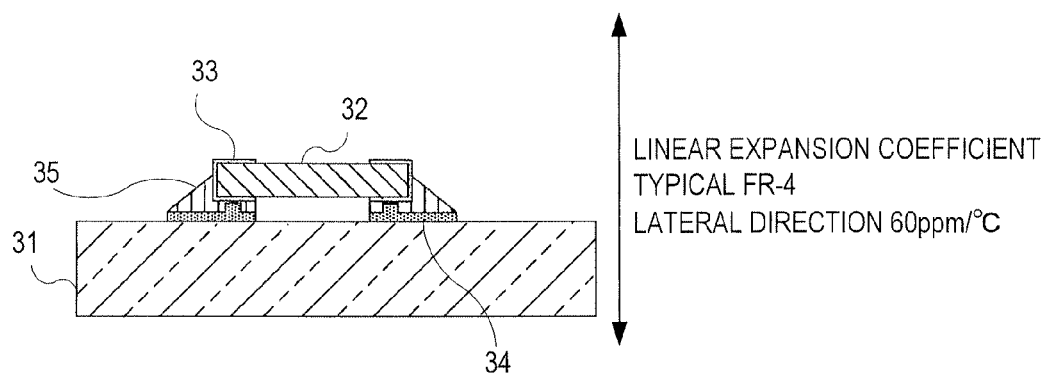
FIG. 21 is a section view of another oscillator according to the fourth group.
Figure 22A:
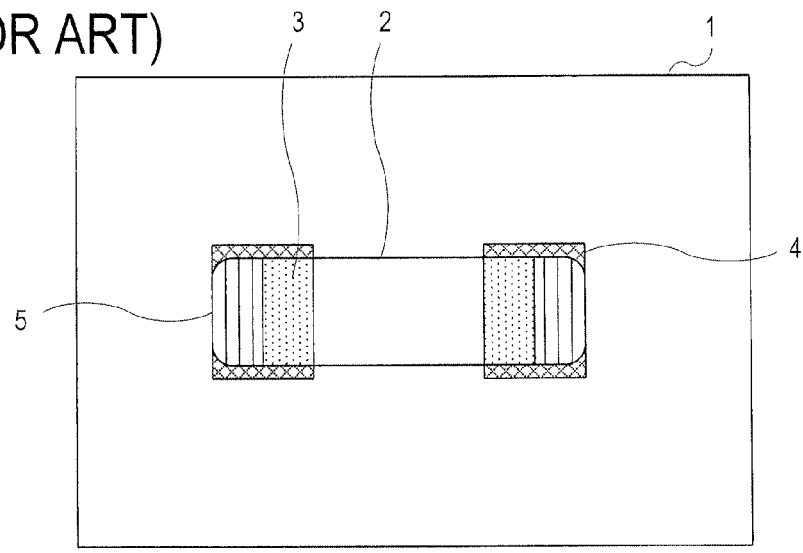
FIG. 22A is a plan view of a conventional crystal oscillator.
Figure 22B:
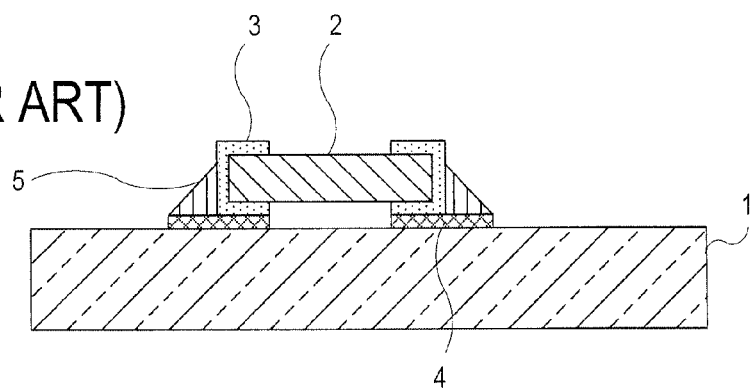
FIG. 22B is a section view of the conventional crystal oscillator.

[Another Embodiment According to Fourth Group: FIG. 21]

An oscillator according to another embodiment (another oscillator according to the fourth group) is described below, with reference to FIG. 21. FIG. 21 is a section view of the oscillator according to another embodiment in the fourth group.

As shown in FIG. 21, in another oscillator according to the fourth group, a projection (protrusion) is formed on the electrode pattern 34 at a part of contact with the terminal electrode 33 so that the solder 35 forms a fillet, based on the structures in FIGS. 17 to 20.

In detail, the projection formed on the electrode pattern 34 enables a space to be created under the terminal electrode 33, and the solder 35 rises up in the space by reflow and forms a fillet. Thus, the strength of the solder 35 can be enhanced. This has an advantageous effect of suppressing a solder crack and improving heat cycle resistance performance.

In the oscillator in FIG. 21, too, the electrode patterns 34 are arranged in the direction (longitudinal direction) with the smallest linear expansion coefficient of the board 31 in FIGS. 17 to 20. Hence, another oscillator according to the fourth group equally has an advantageous effect of relaxing stress on the solder 35 due to a difference in linear expansion coefficient between the board 31 and the electronic component 32 and suppressing a crack in the solder 35.

[Advantageous Effect of Embodiment According to Fourth Group]

In the oscillator according to the fourth group, the direction in which the two-terminal electrode patterns 34 formed on the epoxy resin board 31 face each other is set to match the direction in which the linear expansion coefficient of the board 31 is small. This has an advantageous effect of relaxing stress on the solder 35 applied onto the electrode patterns 34 due to a temperature change, suppressing a crack in the solder 35, and improving heat cycle resistance performance.

In the oscillator according to the fourth group, regarding the four-terminal electrode patterns 34a, 34b, 34c, and 34d formed on the epoxy resin board 31, the direction in which the electrode patterns 34a and 34c or the electrode patterns 34b and 34d at the positions corresponding to the corners on the same longer side of the electronic component 32 face each other is set to match the direction in which the linear expansion coefficient of the board 31 is small. This has an advantageous effect of relaxing stress on the solder 35 applied onto the electrode patterns 34 due to a temperature change, suppressing a crack in the solder 35, and improving heat cycle resistance performance.

In another oscillator according to the fourth group, based on the structure of the above-mentioned oscillator, the projection is formed on each electrode pattern 34 at the part connected to the corresponding terminal electrode 33 to create a space between the terminal electrode 33 and the electrode pattern 34, and the solder 35 forms a fillet in the space. This has an advantageous effect of enhancing the strength of the solder 35, suppressing a crack in the solder 35, and improving heat cycle resistance performance.

The present invention is suitable for an oscillator that can suppress a solder crack caused by a temperature change by a simple structure at low cost and improve heat cycle resistance performance.

What is claimed is:

1. An oscillator including an epoxy resin board and an electronic component mounted on the board, comprising:
    an electrode land pattern formed on the board by a metal layer;
    a dummy land pattern manufactured by the same metal layer of the electrode land pattern in the same thickness of the electrode land pattern and formed on the board where the electronic component is mounted;
    a solder resist formed so as to cover the dummy land pattern; and
    mount solder for solder-connecting the electrode land pattern and a component electrode formed at an end of the electronic component, in a state where the electronic component is lifted by the dummy land pattern and the solder resist.

2. The oscillator according to claim 1 applied to an oven controlled crystal oscillator.

3. A manufacturing method of an oscillator including an epoxy resin board and an electronic component mounted on the board, comprising:
    forming an electrode land pattern on the board and a dummy land pattern on the board where the electronic component is to be mounted by a same metal layer in the same thickness;
    forming a solder resist so as to cover the dummy land pattern;
    applying solder onto the electrode land pattern;
    mounting the electronic component on the solder resist; and
    solder-connecting the electrode land pattern and a component electrode formed at an end of the electronic component by reflow, in a state where the electronic component is lifted by the dummy land pattern and the solder resist.

* * * * *